(12) United States Patent
Ghassemi

(10) Patent No.: US 6,919,717 B2
(45) Date of Patent: Jul. 19, 2005

(54) CAPACITOR COUPLED VOLTAGE TRANSFORMER AND ITS INPUT VOLTAGE PARAMETER DETERMINATION

(76) Inventor: Foroozan Ghassemi, 77 Harston Dr., Enfield Island Village, Enfield (GB), EN3 6GJ ( * ) Notice: Subject to any disclaimer, the term of this patent is extended or adjusted under 35 U.S.C. 154(b) by 0 days.

(21) Appl. No.: 10/275,054

(22) PCT Filed: May 3, 2001

(86) PCT No.: PCT/GB01/01950

§ 371 (c)(1), (2), (4) Date: Mar. 7, 2003

(87) PCT Pub. No.: WO01/84164

PCT Pub. Date: Nov. 8, 2001

(65) Prior Publication Data

US 2003/0164714 A1 Sep. 4, 2003

(30) Foreign Application Priority Data

May 3, 2000 (GB) .............................. 0010720

(51) Int. Cl.[7] .................................................. G01R 1/14
(52) U.S. Cl. ................................... 324/126; 324/117 R
(58) Field of Search ................................. 324/126–128, 324/117 R; 361/15–16, 268, 270, 301.1, 302–303; 383/59–63; 336/69

(56) References Cited

U.S. PATENT DOCUMENTS

| | | | | |
|---|---|---|---|---|
| 3,870,926 A | * | 3/1975 | Hughes | 324/126 |
| 3,870,927 A | * | 3/1975 | Hughes | 324/126 |
| 3,947,725 A | * | 3/1976 | Lucas | 324/126 |
| 4,196,388 A | * | 4/1980 | Weller et al. | 324/128 |
| 4,327,390 A | | 4/1982 | Despiney | |
| 4,591,783 A | * | 5/1986 | Mastner | 324/126 |
| 4,906,937 A | * | 3/1990 | Wikstrom et al. | 324/522 |
| 4,914,382 A | | 4/1990 | Douville et al. | |
| 5,432,438 A | * | 7/1995 | Baumgartner et al. | 324/127 |
| 5,473,244 A | | 12/1995 | Libove et al. | |
| 5,991,177 A | * | 11/1999 | Kaczkowski | 363/62 |

* cited by examiner

*Primary Examiner*—Vinh Nguyen
*Assistant Examiner*—Jermele Hollington
(74) *Attorney, Agent, or Firm*—Young & Thompson

(57) ABSTRACT

Accurate harmonic measurements on electrical power systems where the main instrument transformers are of the capacitor coupled voltage type (CVT type) is made possible by the provision of one or more current sensors (PQCS1, PQCS2). CVTs typically have a high voltage capacitor bank (CH) and a low voltage capacitor bank (CL). One or more current sensors (PQCS1, PQCS2) is/are positioned so as to measure capacitor current and from that the input voltage (Vin) of the CVT can be determined for each frequency.

14 Claims, 2 Drawing Sheets

CAPACITOR COUPLED VOLTAGE TRANSFORMER AND ITS INPUT VOLTAGE PARAMETER DETERMINATION

FIELD OF THE INVENTION

This invention relates generally to capacitor coupled voltage transformers, also known as capacitor voltage transformers or CVTs. These transformers are used inter alia as the main transformers for interfacing instrumentation, such as meters and protection devices, with extra high voltage (EHV) and ultra high voltage (UHV) systems.

BACKGROUND TO THE INVENTION

Capacitor voltage transformers are presently preferred to conventional electromagnetic type transformers because, in comparison, they are less expensive and are smaller in size.

However, due to their construction, CVTs do not have a good frequency characteristic and are generally tuned to give an accurate picture of their primary voltage at a reduced voltage, usually 60 to 110 volts, for the fundamental frequency component only. Accurate measurements at EHV and UHV levels that require a wider bandwidth is not possible if the only instrument transformer present on the system is of the CVT type.

Power quality assessment of electrical power systems has become an important requirement in the modern management of electrical supply systems. One requirement in power quality assessment is compliance with international and domestic standards for harmonic pollution in the system. The standards are applied both to voltages and to currents.

As yet, there is no technically convenient method of measuring harmonic voltages in EHV and UHV systems. This is only possible by using special and costly test and measurement arrangements.

SUMMARY OF THE INVENTION

It is an object of the present invention to enable one successfully to use conventional CVTs in the harmonic measurement of EHV and UHV systems.

It is a further object of the invention to achieve this at minimal cost, with little expenditure of time and with enhanced accuracy of measurement.

It is another object of the invention to make it possible to carry out accurate harmonic measurements on electrical power systems where the main instrument transformers are of the conventional CVT type. This has heretofore not been achievable.

It is yet a further object of the invention to enable capacitor voltage transformers which are already in service to be retrofitted with the means required so as to be in accordance with the invention, and to do this easily and in a cost-effective manner.

In accordance with the present invention there is provided a method of determining parameters of the input voltage to a capacitor coupled voltage transformer which includes high voltage capacitor means and low voltage capacitor means connected across the input voltage, which comprises measuring the current flowing in at least one of said capacitor means, and from the measurements obtaining the required parameters of the input voltage.

Preferably, the required parameters are the harmonic values of the input voltage.

Also in accordance with the invention there is provided a method of retrofitting a capacitor coupled voltage transformer which has high voltage capacitor means and low voltage capacitor means arranged to be connected across an input voltage, whereby parameters of the input voltage can be determined, which comprises fitting the transformer with at least one current sensor to measure the current flowing in at least one of said capacitor means.

The invention also provides a capacitor coupled voltage transformer comprising high voltage capacitor means and low voltage capacitor means arranged to be connected across an input voltage, current sensor means arranged to sense the current flowing in at least one of said capacitor means, and measurement means arranged to provide from the sensed current values a measurement of parameters of the input voltage.

In one embodiment the transformer comprises first and second current sensors respectively to measure the current flowing in said high voltage capacitor means and in said low voltage capacitor means.

In an alternative embodiment the transformer comprises a single current sensor arranged to measure the total current in the transformer. By using an approximation method one can still obtain the required parameters with just the single current sensor.

BRIEF DESCRIPTION OF THE DRAWINGS

In order that the invention may be more fully understood, a number of embodiments in accordance with the invention will now be described by way of example and with reference to the accompanying drawings. In the drawings.

DESCRIPTION OF THE PREFERRED EMBODIMENTS

Figure 1:
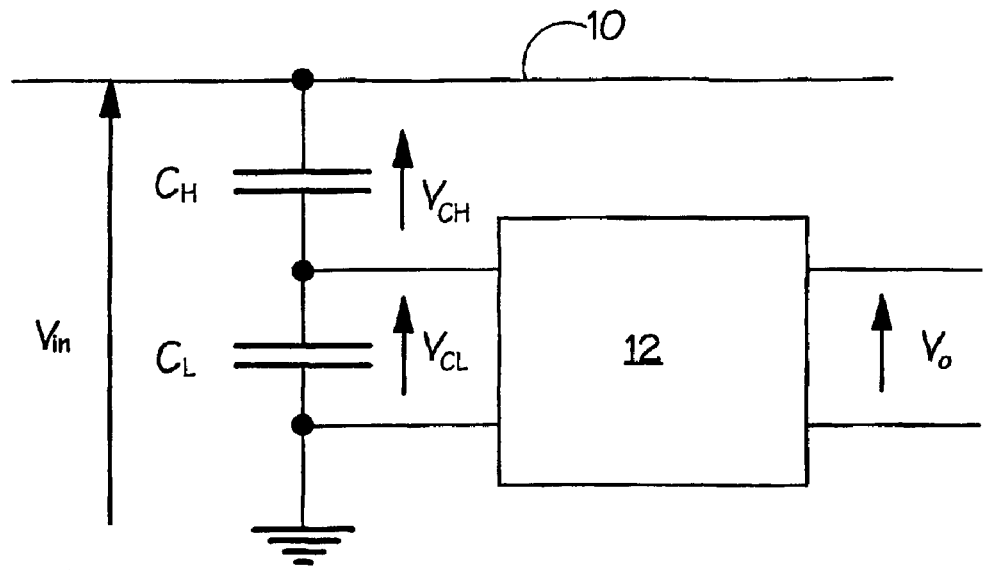
FIG. 1 is a schematic circuit diagram of a conventional, known capacitor voltage transformer.

Before describing the embodiments in accordance with the invention, reference is first made to the prior art CVT shown in FIG. 1. $C_H$ and $C_L$ are high and low voltage capacitor banks respectively, connected in series between a rail 10 and earth. Connected across the low voltage capacitor bank $C_L$ are the other components of the CVT, usually a tuning reactor, a step-down transformer and a ferroresonance oscillation damping circuit. These components are indicated generally at 12. The input voltage to the CVT is indicated as $V_{in}$, and the output voltage as $V_o$. The voltage drop across the high voltage capacitor $C_H$ is indicated as $V_{CH}$ and the voltage drop across the low voltage capacitor $C_L$ is indicated as $V_{CL}$.

The inherent characteristics of a CVT make it behave electrically as a filter, with the main bandpass accurately tuned to the fundamental frequency component. This in turn implies that the transformer output does not represent an accurate picture of the frequency contents of the input signal over the complete frequency spectrum.

The sum of the voltage drop $V_{CH}$ across the high voltage capacitor $C_H$ and the voltage drop $V_{CL}$ across the low voltage capacitor $C_L$ is always equal to the input voltage $V_{in}$, irrespective of the components and connections in circuit 12. This relationship holds true at all frequencies in the spectrum. Also, the current that flows in the CVT is a function of the input voltage $V_{in}$.

Therefore, if one knows the values of the capacitors $C_H$ and $C_L$ and also the current in each capacitor bank, the input voltage $V_{in}$ can be measured. This is valid for all frequencies in the input signal.

The values of $C_H$ and $C_L$ are known by their design and are given in the CVT data sheet. It is proposed in accordance with the invention that the currents in the respective capacitor banks $C_H$ and $C_L$ are measured using current sensors.

Figure 2:
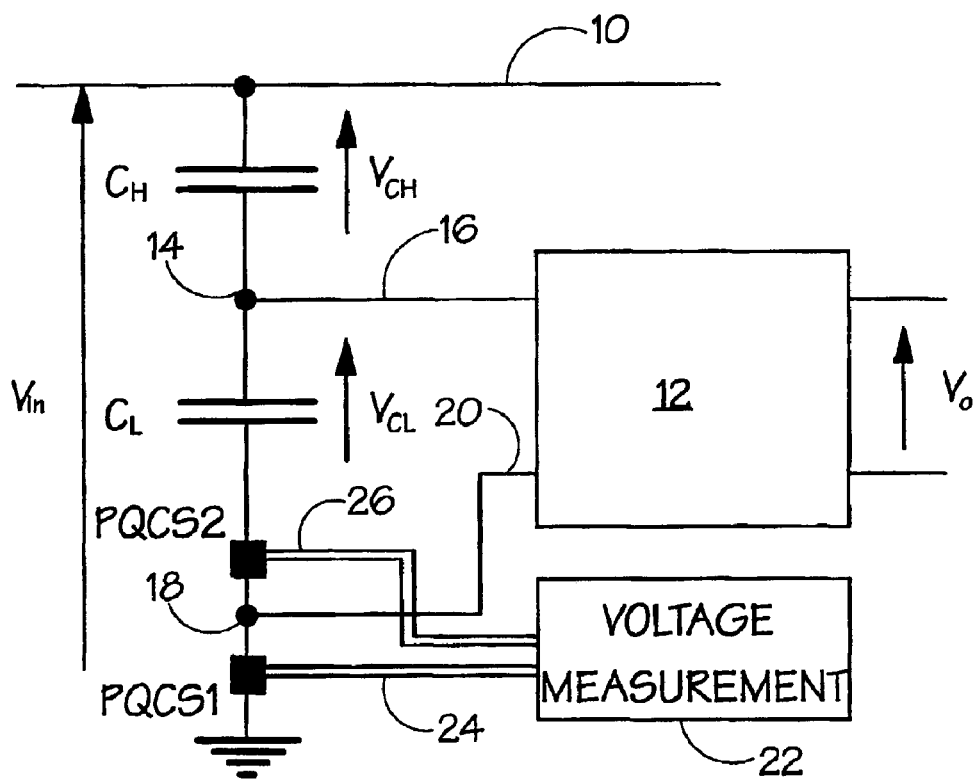
FIG. 2 is a schematic circuit diagram of the transformer of FIG. 1 modified in accordance with the invention by the addition of two current sensors; and, FIG. 3 is a schematic circuit diagram of the transformer of FIG. 1 modified in accordance with the invention by the addition of a single current sensor, using an approximation method.

FIG. 2 shows the inclusion of current sensors in accordance with the invention. The current sensors are referred to as power quality current sensors and are indicated at PQCS1 and PQCS2. They are connected in series with the capacitor banks and between the low voltage capacitor bank $C_L$ and earth. The circuit 12 is connected to a point 14 between the two capacitor banks by a first lead 16 and to a point 18 between the two current sensors by a lead 20. Each of the current sensors PQCS1 and PQCS2 is connected to a voltage measurement circuit 22 by leads 24 and 26 respectively.

The current sensors PQCS1 and PQCS2 may be of any suitable type, for example current transformers or Hall effect devices.

In FIG. 2, sensor PQCS1 measures the total current to the CVT that flows in the high voltage capacitor bank $C_H$. The other sensor PQCS2 measures the current flowing in the low voltage capacitor bank $C_L$. The placement of sensor PQCS1 may be different from that shown in FIG. 2, depending upon the type and make of the CVT, but it is essential that it measures the total current in the CVT.

The current sensors PQCS1, PQCS2 may have protective devices connected across them to prevent damage resulting from internal CVT faults. Such protective devices are preferably installed at a point where they are at earth potential, in order to reduce or eliminate the need for high levels of insulation for the protective devices.

The output signals from the current sensors PQCS1, PQCS2 are fed to the voltage measurement circuit 22. In circuit 22 the voltages across each capacitor bank $C_H$ and $C_L$ are first obtained, and then the total input voltage $V_{in}$ is deduced by adding the two voltages together.

In a modification to the circuit shown in FIG. 2, in some designs of capacitor voltage transformer, it may be easier to connect one or other of the current sensors PQCS1 and PQCS2 in the return conductor 20 from circuit 12. However, regardless of where the current sensors are positioned, the object is to measure the total CVT current and the current through the low voltage capacitor $C_L$ from two branches.

A further simplification in the measurement is possible by accepting an approximation in relation to the CVT circuit. This approximation introduces some errors in the harmonic measurement, but these errors have been shown to be relatively small for different CVT models which have been considered.

Figure 3:
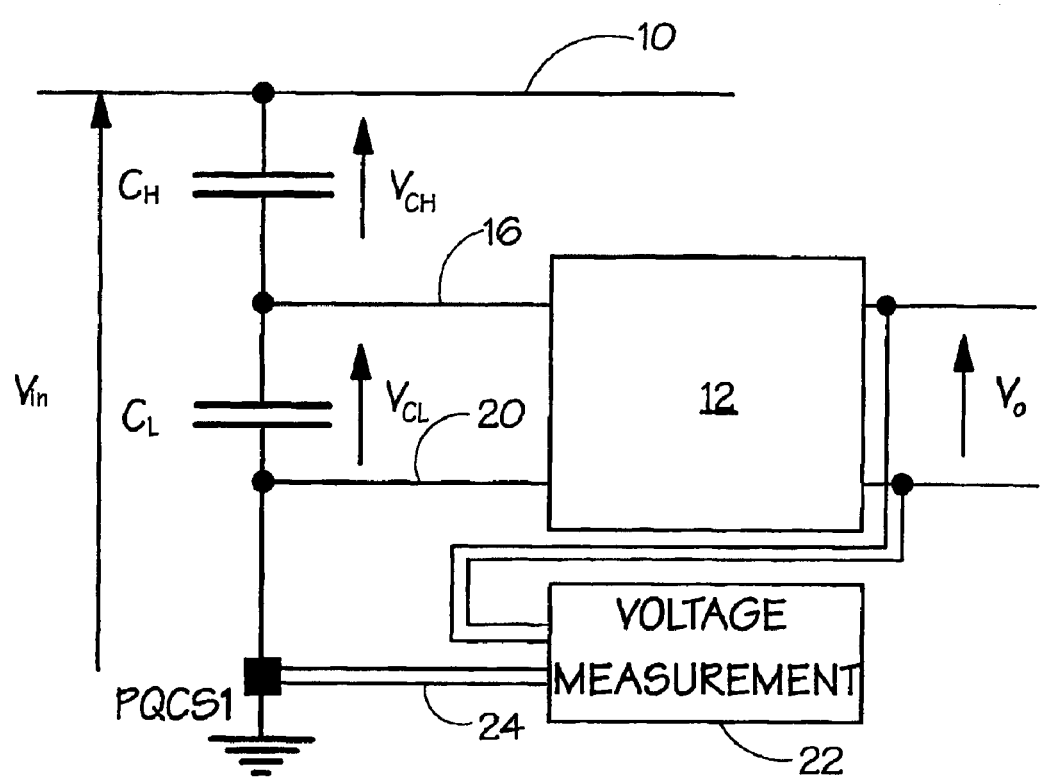

In the simplified method, which is illustrated by the circuit of FIG. 3, only the total current in the CVT is measured. This total current may be measured by using only one power quality current sensor PQCS1 located in the main earth path of the CVT. The sensor is connected to the voltage measurement circuit 22 by lead 24 and the voltage measurement circuit 22 is connected to the output side of circuit 12. The main voltage drop in a capacitor voltage transformer is on the high voltage capacitor bank $C_H$. Having measured the current in the CVT, it may be assumed that all system voltage drops are across a newly calculated or a compensated high voltage capacitor. The capacitance of the new fictitious or compensated capacitor is calculated using the CVT output voltage $V_o$ at the fundamental frequency component, the CVT nominal transformation ratio which is known and assumed accurate, and the CVT current at the fundamental frequency component. When the capacitance of the fictitious capacitor is known, then the voltages of other frequencies can be calculated using the measured current. The advantage which is achieved using this approximation method is that only one current sensor PQCS1 is needed in order to measure the total current in the CVT.

Depending upon the make, type and model of the CVT, the current sensor or sensors can be placed in locations where the required currents would be subsequently obtained. For example, it may not be possible to acquire the currents in the low voltage and high voltage capacitors directly. The current sensors may then be placed in available locations in the earth path, such that the low voltage and/or high voltage capacitor currents are obtained by combining the measured currents. For instance, it is often convenient to access the earthing point of the low voltage capacitor $C_L$, which is a suitable point for placing a current sensor to measure the low voltage capacitor current. In most CVTs, the internal circuit of the CVT, indicated at 12 in the foregoing description, is earthed separately. The earthing point of circuit 12 may be used for a current sensor.

Customarily, the measured/formed currents in the low voltage and high voltage capacitors $C_L$ and $C_H$ are multiplied by the reactance of the low voltage and high voltage capacitors at each frequency in order to obtain the voltage across each component. By adding these voltages, the input voltage of the CVT can be calculated for each frequency.

In harmonic measurements of electrical systems, the harmonic levels are expressed as a percentage of the fundamental frequency component. In fact, all international and national harmonic standards have been presented in the percentage form. With the present invention, harmonic percentage with respect to the fundamental can be calculated without using the reactance of the capacitors. This means that the accuracy of the percentage measurement is not dependent on the tolerance in the values of the capacitors. This is achieved by using the magnitude of the currents measured in the low voltage and high voltage capacitors $C_L$ and $C_H$.

The use of current sensors in accordance with the invention can be incorporated into the design of new CVTs. It is also easy and cost-effective to retrofit CVTs which are in service by placing current sensors in appropriate locations to effect the required measurements.

It is emphasised that other current sensor arrangements can be envisaged within the scope of the present invention, in terms of number and positioning.

I claim:

1. A method of determining parameters of an input voltage to a capacitor coupled voltage transformer which includes high voltage capacitor means and low voltage capacitor means connected across the input voltage, the method comprising:
   measuring the current flowing in at least one of said capacitor means, and
   from the measurements obtaining the required parameters of the input voltage,
   wherein the measuring step comprises separately measuring the current flowing in each of said high voltage capacitor means and said low voltage capacitor means, obtaining from said measured values the voltages across each of said capacitor means, and summing the said voltages to obtain parameters of the total input voltage.

2. A method of determining parameters of an input voltage to a capacitor coupled voltage transformer which includes high voltage capacitor means and low voltage capacitor means connected across the input voltage, which comprises measuring the current flowing in at least one of said capacitor means, and from the measurements obtaining the required parameters of the input voltage, in which the required parameters are the harmonic values of the input voltage.

3. A method according to claim 2, in which the harmonic values are expressed as a percentage of the fundamental frequency.

4. A method according to claim 2, which comprises measuring only the total current in the transformer using a single current sensor.

5. A method of retrofitting a capacitor coupled voltage transformer which has high voltage capacitor means and low voltage capacitor means arranged to be connected across an input voltage, whereby parameters of the input voltage are determined in accordance with claim 2, which comprises fitting the transformer with at least one current sensor to measure the current flowing in at least one of said capacitor means.

6. A capacitor coupled voltage transformer comprising high voltage capacitor means and low voltage capacitor means arranged to be connected across an input voltage, current sensor means arranged to sense the current flowing in at least one of said capacitor means, and measurement means arranged to provide from the sensed current values a measurement of parameters of the input voltage, in which the parameters are harmonic values of the input voltage.

7. A transformer according to claim 6, in which the harmonic values are expressed as a percentage of the fundamental frequency.

8. A transformer according to claim 6 which comprises a single current sensor arranged to measure the total current in the transformer.

9. A transformer according to claim 8, in which the high voltage capacitor means and the low voltage capacitor means are connected in series across the voltage input, and the current sensor is connected between the low voltage capacitor means and earth.

10. A capacitor coupled voltage transformer comprising;
high voltage capacitor means and low voltage capacitor means arranged to be connected across an input voltage,
current sensor means comprising first and second current sensors respectively to measure the current flowing in said high voltage capacitor means and in said low voltage capacitor means, and
measurement means arranged to provide from the sensed current values a measurement of parameters of the input voltage.

11. A transformer according to claim 10, in which said high voltage capacitor means and said low voltage capacitor means are connected in series across the voltage input, and the current sensors are connected in series and between the low voltage capacitor means and earth.

12. A transformer according to claim 11, which includes voltage measurement means connected to both current sensors and arranged to provide voltage parameters by summation of voltage values deduced from the currents flowing in the respective capacitor means.

13. A transformer according to claim 10, in which the current sensors are current transformers.

14. A transformer according to claim 10, in which the current sensors are Hall effect devices.

* * * * *